United States Patent [19]

Asato et al.

[11] Patent Number: 5,126,965

[45] Date of Patent: Jun. 30, 1992

[54] CONDITIONAL-SUM CARRY STRUCTURE COMPILER

[75] Inventors: Creighton S. Asato, Sunnyvale; Christoph Ditzen, San Jose, both of Calif.

[73] Assignee: VLSI Technology, Inc., San Jose, Calif.

[21] Appl. No.: 696,310

[22] Filed: Apr. 29, 1991

Related U.S. Application Data

[63] Continuation of Ser. No. 370,550, Jun. 23, 1989, abandoned.

[51] Int. Cl.⁵ .............................................. G06F 7/50
[52] U.S. Cl. .................................................. 364/788

[56] References Cited

U.S. PATENT DOCUMENTS

| 4,525,797 | 6/1985 | Holden | 364/788 |
| 4,682,303 | 7/1987 | Uya | 364/788 |
| 4,764,888 | 8/1988 | Holden et al. | 364/788 |

FOREIGN PATENT DOCUMENTS

| 57-147754 | 9/1982 | Japan . |
| 61-221822 | 10/1986 | Japan . |
| 62-75840 | 4/1987 | Japan . |

Primary Examiner—Long T. Nguyen
Attorney, Agent, or Firm—Burns, Doane, Swecker & Mathis

[57] ABSTRACT

A conditional-sum carry structure has an architecture which is sufficiently regular that the structure can be conveniently generated by an automated compiler. The carry structure includes a column of input cells, each of the cells in the column being operative for receiving binary numbers and, for each of the received numbers, generating a sum bit and two carry-out bits. Further the carry structure includes an array of columns of binary logic elements comprised of dual multiplexers (MUX MUX elements), dual exclusive OR gates (XOR XOR elements), multiplexer and exclusive OR gate circuits (MUX XOR elements) and multiplexer units (ONE MUX elements) for receiving sum bits and carry-out bits from the input cells and for performing the operations of a conditional-sum carry structure.

4 Claims, 4 Drawing Sheets

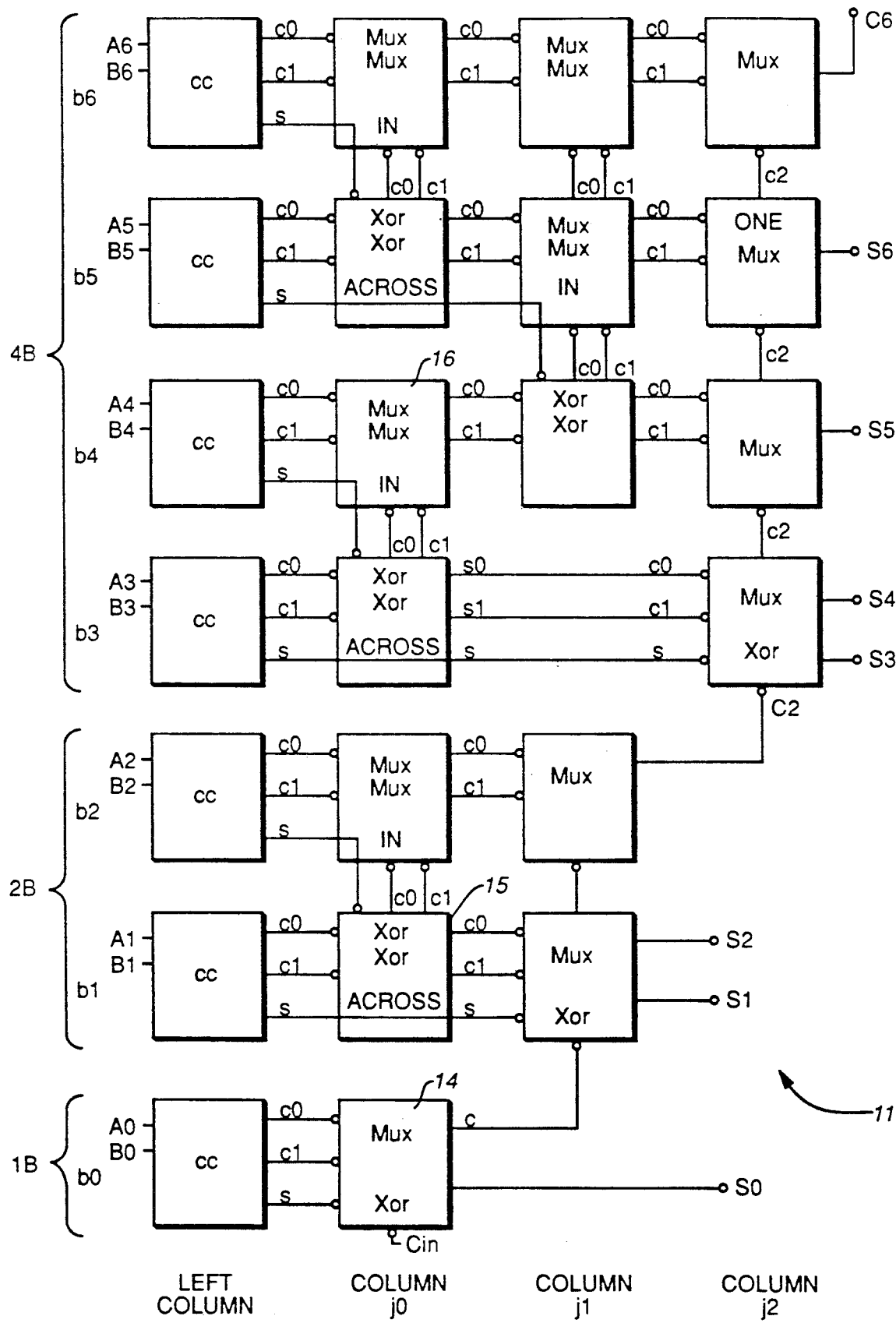
*FIG._1*

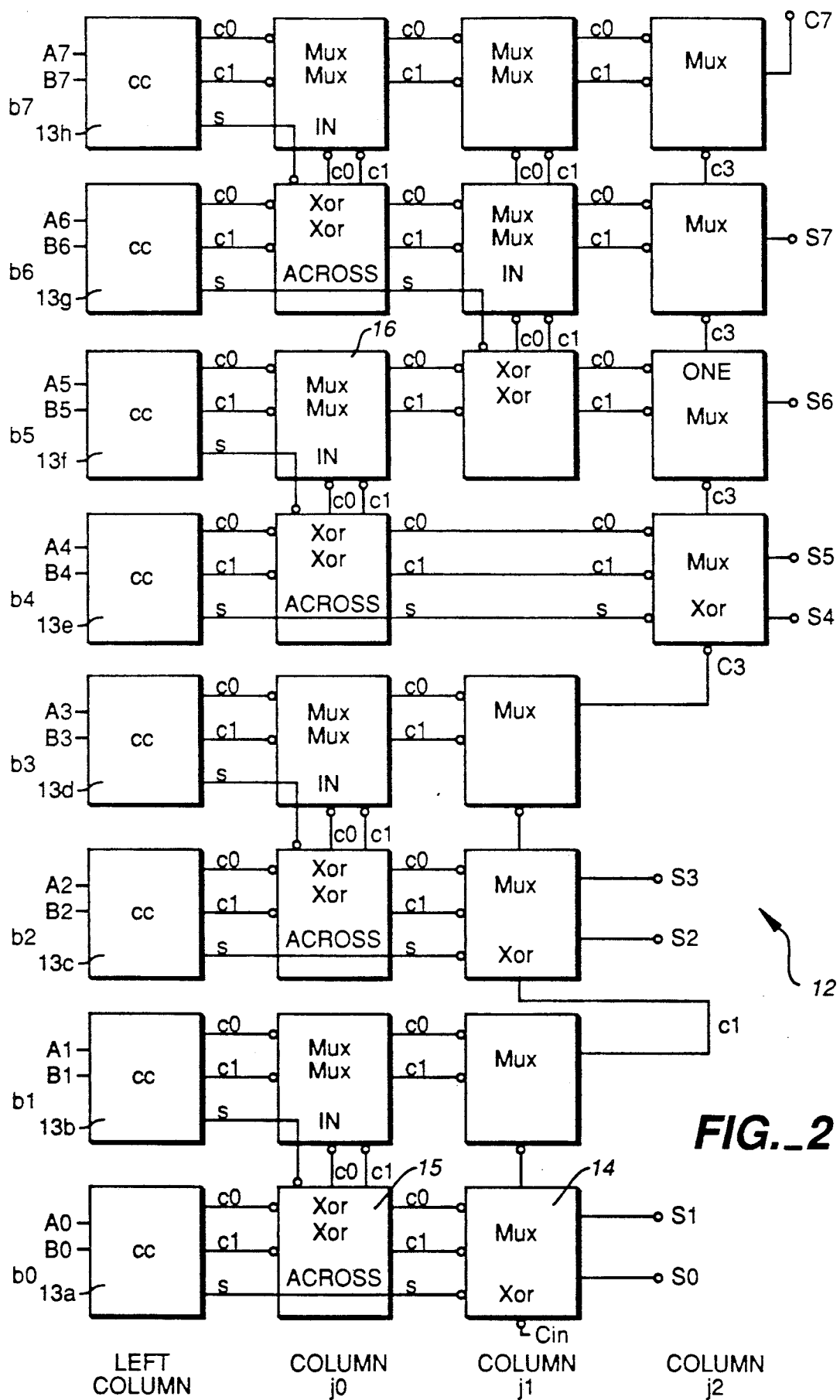
FIG._2

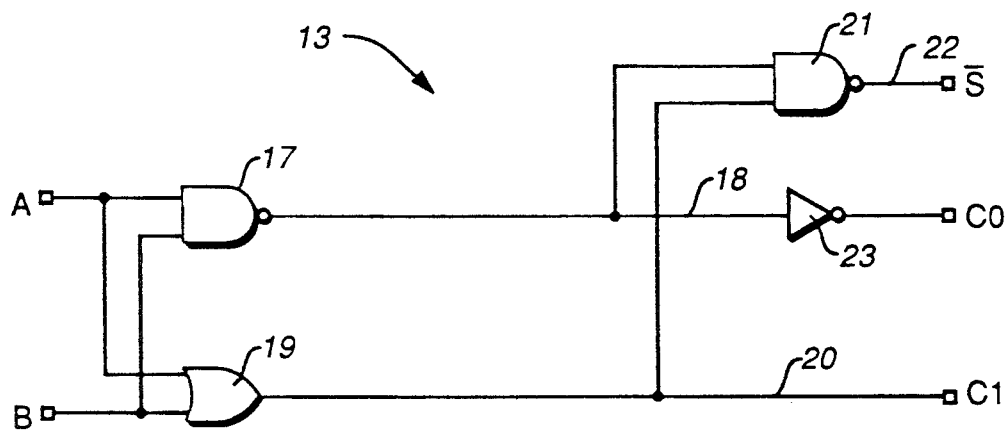
FIG._3
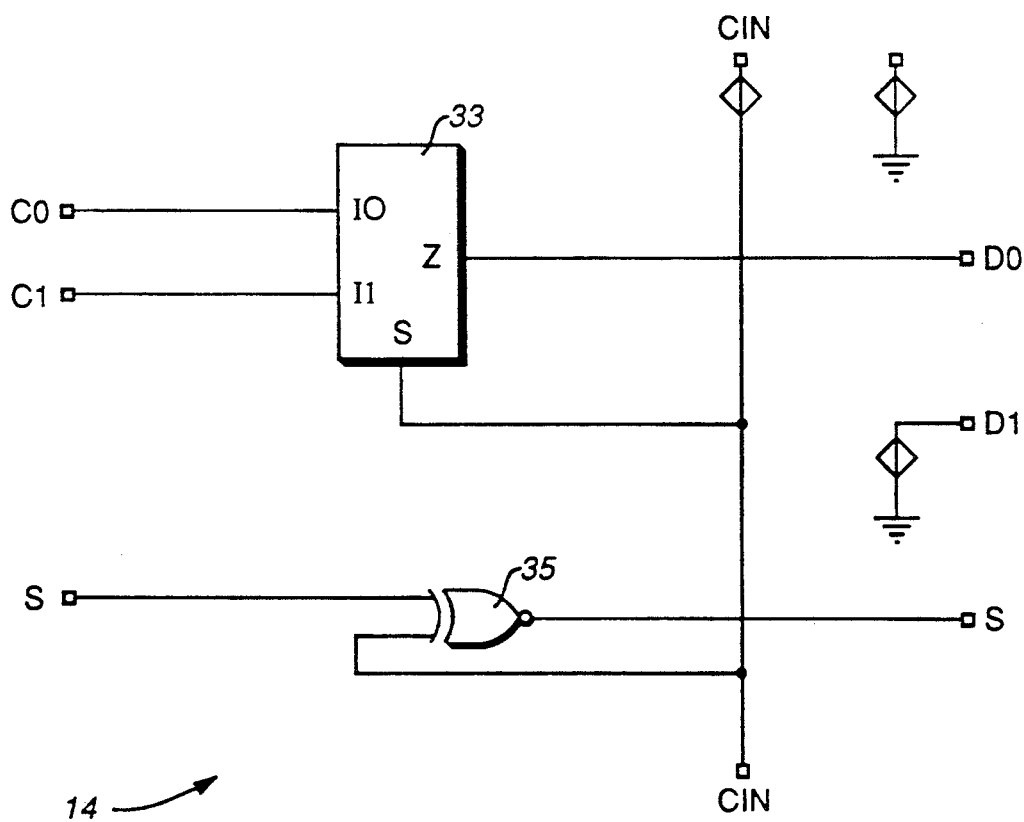
FIG._4

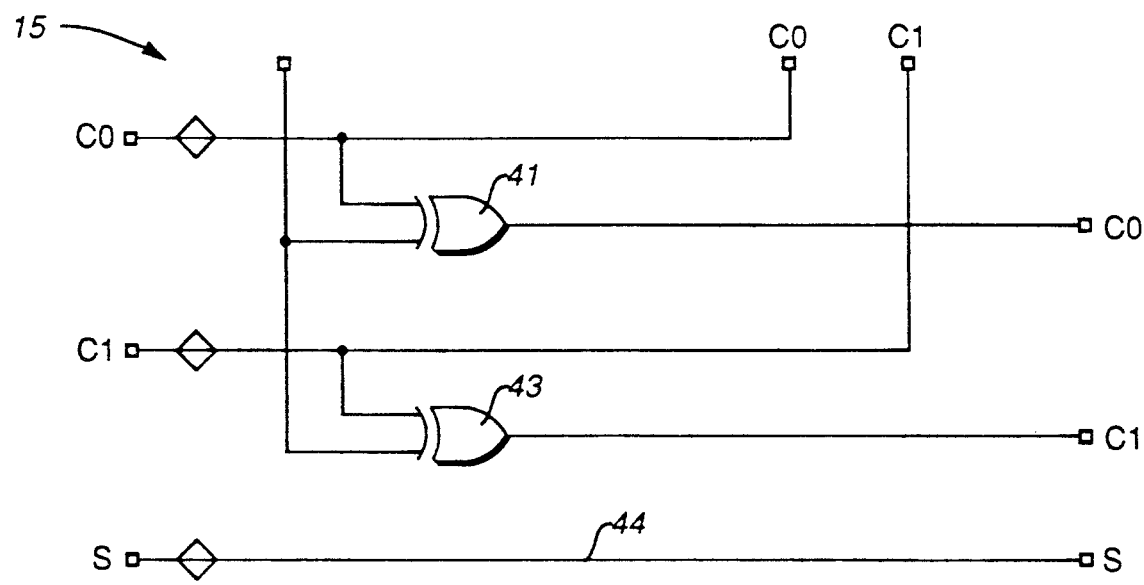
FIG._5
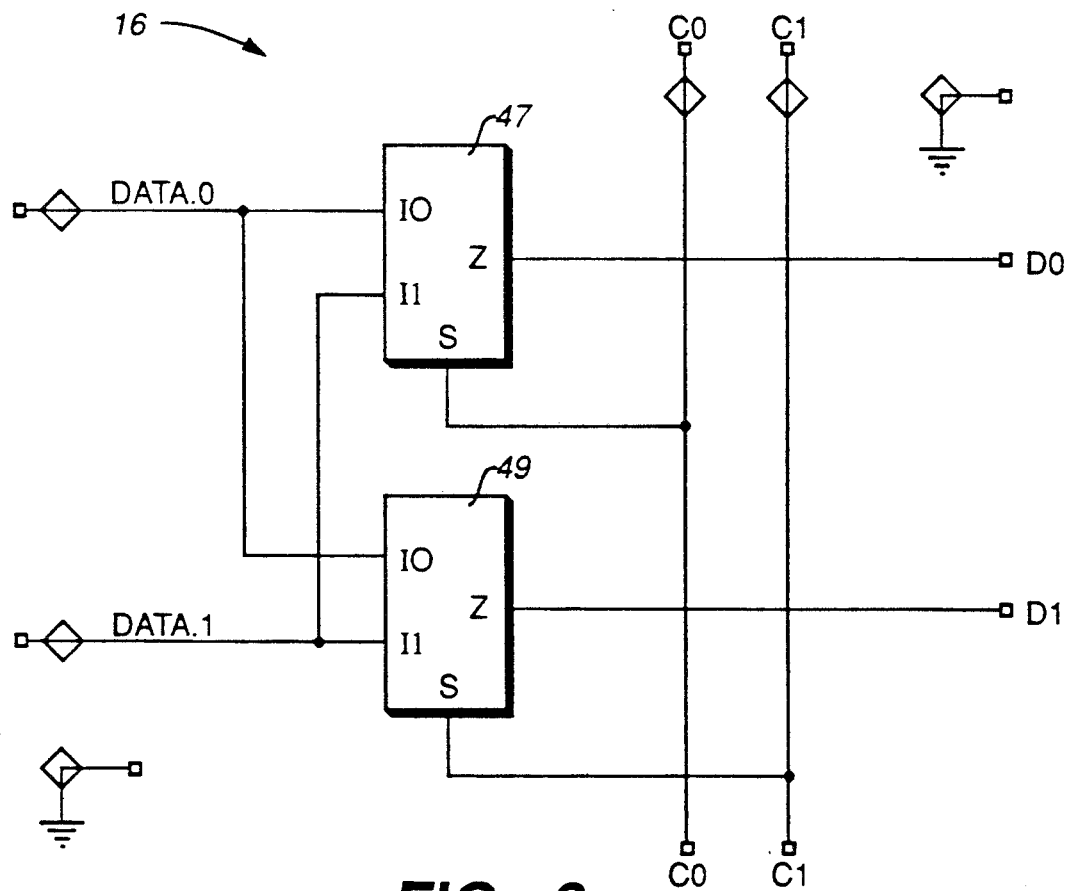
FIG._6

CONDITIONAL-SUM CARRY STRUCTURE COMPILER

This application is a continuation of U.S. application Ser. No. 07/370,550, filed Jun. 23, 1989 now abandoned.

BACKGROUND OF THE INVENTION

1. Field of the Invention

The present invention generally relates to compilers for generating application-specific integrated circuits and, more particularly, to compilers for generating conditional-sum carry structures for use in application-specific integrated circuits.

2. State of the Art

It is well known to provide integrated circuits, or "chips", of the type known as application-specific integrated circuits (ASICs). In essence, ASIC chips are custom-designed circuits of the LSI (large scale integration) or VLSI (very large scale integration) class. ASIC chips often include one or more functional blocks or "cells" which, individually, may be classified as LSI or VLSI circuits. For instance, the cells within an ASIC chip may comprise one or more random access memories (RAMs), read-only memories (ROMs), or arithmetic logic units (ALUs). Also, cells can be as simple as an individual logic gate.

To efficiently and economically design ASIC chips, it is necessary to use automated systems, usually referred to as compilers. Compilers allow circuit designers to custom design ASIC chips by drawing upon libraries containing standardized designs of circuits that can comprise cells within ASIC chips. Also, compilers can themselves include compiling sub-systems. For example, in designing an ASIC chip with a compiler, a design engineer may want a functional block to include one or more ALU circuits and, rather than designing the ALU circuits himself, the engineer may want a compiling sub-system to design the ALU circuits while including some special connections that he has specified.

Compilers can, of course, generate circuits for uses other than in ASIC chips. For instance, compiler systems can design circuits for implementation on printed circuit boards. The following emphasis on compilers that generate ASIC chips is not intended to exclude their other uses.

In view of the preceding discussion, it can be appreciated that, for compiler systems to be practical and commercially acceptable, the systems must allow circuit designers flexibility in modifying functional blocks within ASIC chips. For instance, circuit designers often want the flexibility to modify standard ALU cells to accommodate different bit widths. For such modifications to be easily accomplished by automated compilers (or compiling sub-systems), the standard cells must have regular and relatively non-complex architectures. At the same time, however, the standard cells usually must be able to process data quickly, so that their host circuits are not slowed. In particular, it is usually important that ALU cells operate at high speeds.

To provide high-speed ALU circuits, it is known to implement the circuits as so-called "conditional-sum adders". The advantage of conditional-sum adders is that their data delay is a logarithmic function of bit width. Thus, a 32-bit ALU circuit which is implemented as a conditional-sum adder has only a slightly longer delay than a 16-bit conditional-sum adder (since the logarithm of the number 32 only slightly exceeds the logarithm of the number 16). By way of contrast, conventional adders have data delays that increase approximately linearly with bit width; for example, a conventional 32-bit ripple-carry adder is typically only about one-half as fast as a 16-bit ripple-carry adder. In fact, the slowness of ripple-carry adders can be substantial constraint on circuit designs at bit widths greater than about sixteen bits.

The speed of operation of conditional-sum adders is primarily a result of their generating sets of two different carry-out bits at each of a number of internal stages. More particularly, at various internal stages, conditional-sum adders generate a first carry-out bit based upon the assumption that the actual carry-in bit to the stage will have one binary value (e.g., high or binary 1) and, also, generate a second carry-out bit based upon the assumption that the actual carry-in bit will have a complementary binary value (e.g. low or binary 0). The first and second carry-out bits are usually referred to as either "provisional" or "conditional" carry bits, and the two terms will be used interchangeably herein.

Because provisional sums and provisional carry-out bits can be calculated at various stages of a conditional-sum adder without the stages waiting for actual carry-in bits, numerous provisional additions can be made at the same time. Thereafter, the actual carry bits can "ripple" through a conditional-sum adder at a rate which is faster than with ordinary adders, especially, ripple-carry adders of high bit widths.

Although conditional-sum adders provide benefits in terms of data-handling speed at high bit widths, the fact that provisional carry-out bits are generated at numerous stages in the adders results in the devices being "architecturally" complex and irregular. Moreover, the architecture of those devices causes modifications, such as bit-width modifications, to be difficult to accomplish. Thus, conditional-sum adders of conventional architecture cannot be readily generated by computer algorithms and, therefore, are not well suited for use by automated compiling systems.

Conditional-sum adders are further described at chapter 4 of the text, Computer Arithmetic Principles, Architecture, and Design, by Kai Hwang (Wiley, 1979). As explained in that text, conditional-sum adders can be grouped to accomplish operations such as multiplication and division. Furthermore, by employing additional logic elements, the adders can be transformed into ALU circuits that perform various binary logic operations as well as arithmetic operations. Accordingly, the emphasis in the following on conditional-sum adders is not intended to exclude their use as ALU circuits.

SUMMARY OF THE INVENTION

Generally speaking, the present invention provides conditional-sum carry structures, such as adders, whose architectures are sufficiently regular that they can be conveniently generated in various bit widths by automated compiler systems.

BRIEF DESCRIPTION OF THE DRAWINGS

The present invention can be further understood by reference to the following description and the appended drawings which illustrate the preferred embodiments of the invention. For purposes of description, identical components are given the same reference numerals in the various drawing figures. In the drawings:

FIG. 1 is a schematic block diagram of one embodiment of a 7-bit conditional-sum adder according to the present invention;

FIG. 2 is a schematic block diagram of one embodiment of an 8-bit conditional-sum adder according to the present invention;

FIG. 3 is a schematic circuit diagram of an input cell for use in the conditional-sum adders of FIGS. 1 and 2;

FIG. 4 is a schematic circuit diagram of a MUX XOR cell for use in the conditional-sum adders of FIGS. 1 and 2;

FIG. 5 is a schematic circuit diagram of an XOR XOR cell for use in the conditional-sum adders of FIGS. 1 and 2; and FIG. 6 is a schematic circuit diagram of a dual multiplexer circuit for use in the conditional-sum adders of FIGS. 1 and 2.

DETAILED DESCRIPTION OF THE PREFERRED EMBODIMENTS

FIG. 1 shows a seven-bit conditional-sum adder, generally designated by the number 11, for use as a standard cell in automated compiler systems. Adder 11 includes component cells which form groups designated, respectively, 1B, 2B, and 4B. As will be explained further below, group 1B comprises cells for addition of binary numbers which are one bit wide; group 2B comprises cells for addition of binary numbers which are two bits wide; and, finally, group 4B comprises cells for addition of binary numbers which are four bits wide. Together, the three groups can provide addition of binary numbers which are up to seven bits wide.

For purposes of reference, the horizontal rows of cells in conditional-sum adder 11 of FIG. 1 are labelled as b0, b1, ..., b6. It can be understood that those designations correspond to the bit levels of a seven-bit binary number. For instance, the fourth bit a seven bit binary number would be processed by the components as bit level b3. Also for purposes of reference, vertical columns of cells in adder 11 are labelled as j0, j1, and j2. Thus, any one of the component cells in the adder can be uniquely identified. For example, the set designated {b4, j2} identifies the MUX XOR cell in the fourth row of the third column after the column of input cells "cc".

The output lines of conditional-sum adder 11 of FIG. 1 are designated S0, S1, ... S6 and C6. In operation of the adder, the output line S0 provides a binary "sum" signal which is the least significant bit of a seven-bit binary number. Similarly, line S1 provides a binary sum signal which is the next-least significant bit of a seven-bit binary number, and so forth through output line S6—for a total of seven bits. By way of example, for the seven-bit binary number 1110101, the signal on line S0 would be a binary 1, the signal on line S2 would be a binary 0, and so forth. (In the decimal system, the binary number 1110101 is equivalent to 117.)

The output line C6 for adder 11 of FIG. 1 provides a binary carry bit. For example, if the two seven-bit binary numbers 1110101 and 1000001 were added, the result would be the eight-bit binary number 10110110. (In the decimal system, the sum is 182). The most significant bit of that number is the first of the eight binary digits (i.e., a binary 1); it is that digit which is the carry-out bit provided on line C6. Thus, adder 11 can add binary numbers whose sums range up to the binary number 1111111 without generating a carry-out bit.

FIG. 2 shows an eight-bit conditional-sum adder 12 that can be readily generated by automated compiler systems. It may be noted that adder 12 generates intermediate carry bits at its power-of-two boundaries; for example, carry bits are generated at bit levels b=1, b=3, b=7, and so forth.

The conditional-sum adders in both FIGS. 1 and 2 include a first column of identical cells 13a, 13b, and so forth which are referred to herein as "input" cells. The input cells receive binary numbers to be added. In the illustrated embodiment, lowermost input cell 13a includes input lines A0 and B0, the cell 13b includes input lines A1 and B1, and so forth. Thus, for example, if the seven-bit binary number 1110101 were received by the adder, the signal on line A0 would be a binary one (i.e., the least significant digit), the signal on line A1 would be a binary zero (i.e., the next-least significant digit) and so forth for all seven bits. Likewise if a second binary number 1000011 were to be added to the first number, then the signal on line B0 would be a binary one, the signal on line B1 would be a binary one, and so forth for all seven bits.

The conditional-sum adders of FIGS. 1 and 2 also include cells labelled XOR XOR ACROSS, MUX MUX IN, MUX MUX, MUX XOR, and ONE MUX. The cells labelled MUX XOR are identified by the number 14 in the drawings. The cells labelled XOR XOR ACROSS are identified by the number 15 in the drawings and are referred to herein as dual XOR cells. The cells labelled MUX MUX IN are identified by the number 16 in the drawings and are referred to herein as either dual MUX or dual multiplexer cells. The ONE MUX cells will be referred to as single multiplexer cells.

In operation of the conditional-sum adders of FIGS. 1 and 2, each of the input cells 13a, 13b and so forth generates a binary sum signal, designated by the letter S, which is a non-carry bit resulting from summing two binary numbers. Also, each of the input cells generates two conditional carry-out signals, C0 and C1. (Because of the conditional carry signals, the input cells are labelled "cc" in the drawings). One of the carry-out signals is generated based upon the provisional assumption that the carry-in signal is a binary 0; the other carry-out signal is generated based upon the provisional assumption that the carry-in signal is a binary 1. It should be understood that the carry-out signals C0 and C1 are not necessarily binary complements of each other.

FIG. 3 shows a circuit which comprises a typical one of the input cells for adders 11 or 12. In the illustrated embodiment, the circuit includes a two-input NAND gate 17 connected in parallel with a two-input OR gate 19. Both gates receive the same two input signals. (In the drawing, the two input signals are designated by the letters A and B; those signals could be any one of the pairs of inputs A0B0, A1B1, and so forth.) The output lines 18 and 20 of gates 17 and 19, respectively, are connected as inputs to an AND gate 21. Thus, the circuit provides three separate outputs (i.e., lines 18, 20, and 22) from the respective gates 17, 19, and 21. It should be noted that the signal on output line 18 is inverted by an invertor 23.

In operation of the input circuit of FIG. 3, output lines 18, 20, and 22 provide, respectively, a sum signal S and provisional carry-out signals C0 and C1. The sum signal is the binary sum of signals A and B. One of the carry-out signals is generated based upon the provisional assumption that a carry-in bit is present, and the other carry-out signal is generated upon the provisional assumption that a carry-in bit is not present.

FIG. 4 shows a MUX XOR cell 14 comprised of a two-input multiplexer 33 and an exclusive OR gate 35, usually referred to as an XOR gate. For purposes of explanation of cell 14 and other cells in the adders 11 and 12, the signals on the various lines are given particular labels. For instance, the input lines to multiplexer 33 in FIG. 4 are shown as receiving carry-in signals C0 and C1, respectively. It should be understood that such labels only exemplify signals that can be processed by the cells; thus, for instance, the input signals to multiplexer 33 could alternatively be the provisional-sum signals S0 and S1. In practice, the signals which are provided to a cell depend upon the location of the cell in a carry structure. To emphasize that fact, the output of multiplexer 33 in FIG. 4 is labelled D0, thereby indicating that it is a data signal that can represent various inputs.

Referring still to FIG. 4, the select port of the multiplexer is shown as being connected to receive a carry-in signal Cin. For cases where a cell 14 is located at bit level b0 of the adder, the signal Cin would be a carry-in signal from another logic element. For instance, if a circuit is comprised of two sets of seven-bit conditional-sum adders, then the carry-out bit from one of the adders would be the carry-in signal, Cin, at bit level b0 of the other adder. When a MUX XOR cell is located at a bit level other than level b0, the signal Cin would be carried in from the next-lower group of cells; for instance, signal Cin could be the carry-in signal from group 2B to group 4B in adder 11 of FIG. 1.

Also in circuit 14 of FIG. 4, the two input signals to XOR gate 35 are shown as being a provisional-sum signal S and the carry-in signal Cin. The output of exclusive OR gate 35 is sum signal S. However, it is again noted that the signal labels are for purposes of explanation only, and that the cell can manipulate other signals as well.

Operation of MUX XOR cell 14 of FIG. 4 will now be described for the case where the cell is located at bit level b0 of a conditional-sum adder. In that case, the sum output S of the cell is the sum for that bit level. When a carry-in signal Cin is present, XOR gate 35 inverts the sum signal S to provide consistency with the logic equation for a full adder, namely:

$$S_{out} = Cin \text{ XOR } (A \text{ XOR } B).$$

where "A" and "B" are two inputs to the adder.

Further in operation of input cell 14 of FIG. 4, the output of multiplexer 33 is either the C0 signal or the C1 signal, depending upon the state of the select signal Cin. That is, the selected carry-out signal depends upon the actual carry-in signal. Again this is consistent with the logic equation for a full adder, namely:

$$Cout = (Cin \text{ AND } (A \text{ OR } B)) \text{ OR } (\text{NOT } Cin \text{ AND } (A \text{ AND } B)).$$

FIG. 5 shows a circuit that implements an XOR XOR ACROSS cell 15. Initially, it should be noted that a conductor 44 carries the signal S across the cell without alteration, thereby explaining the ACROSS designation. Further, the circuit comprises a pair of XOR gates 41 and 43, each having two input lines. In the illustrated embodiment, one of the input lines provides a provisional carry-in signal C0 to XOR gate 41, and the other input line provides a provisional carry-in signal C1 to XOR gate 43. Also, signal S is provided to each of the XOR gates. The outputs from the respective XOR gates 41 and 43 are signals C0 and C1.

As to operation of XOR XOR ACROSS circuit 15 of FIG. 5, it should be initially noted that sum signal S is the least significant sum out. The carry-out signals C0 and C1 are the next-to-least significant sums out. One of the carry-outs is generated for the case where the actual carry-in is a binary 0, and the other is generated for the case where the actual carry-in is a binary 1.

Further as to operation of the XOR XOR ACROSS circuit of FIG. 5, it should be noted that the C0 and C1 input lines are also directed to a vertically adjacent cell. As can be seen from FIG. 1, the vertically-adjacent cell is always a XOR XOR IN cell. (The fact that the MUX MUX IN cells receive inputs from the MUX MUX ACROSS cells explains the "IN" designation.)

FIG. 6 shows a typical circuit for implementing the dual multiplexer cells 16. The illustrated circuit generally comprises a pair of two-input multiplexers 47 and 49. The inputs to the two multiplexers are the same and, in the drawing, are designated DATA.0 and DATA.1, respectively, to indicate that the inputs can either be two carry-in signals or two sum signals. Further in the cell, the select input of multiplexer 47 is connected to receive the carry-in signal C0 and the select input of multiplexer 49 is connected to receive the carry-in signal C1.

In operation of circuit 16 in FIG. 6, the output signals from multiplexers 47 and 49 are determined by the states of the provisional carry-in signals C0 and C1, respectively. The output signals are designated DATA.0 and DATA.1 in the drawing to indicate that they can either be carry or sum signals, depending upon the nature of the input signals.

The distinction between the MUX MUX cells and the MUX MUX IN cells can be appreciated by referring to FIG. 2. In the case of the MUX MUX IN cells, a line carrying a sum signal S extends through the cell and is directed to the cell immediately below. (As will be explained later herein, the cell immediately below a MUX MUX IN cell is, invariably, an XOR XOR ACROSS cell.) Thus, the MUX MUX cells are identical to the MUX MUX IN cells except that the former cells do not include lines carrying the sum signals through the cell. (It may also be noted from FIG. 2 that carry signals C0 and C1 can be provided from a MUX MUX IN cell to a MUX MUX cell.)

A ONE MUX cell is not specifically shown in the drawings, but can be understood to be essentially the same as the circuit shown in FIG. 6 but with only a single multiplexer.

An algorithm for generating the conditional-sum adder of FIG. 2 will now be explained. Generally speaking, the algorithm can be understood to construct the adder such that, in each of the columns of the adder, there are cells having a "special" pattern followed by cells having a regularly repeating pattern. For any given column, the cells in the special patterns are below (i.e., occupy lower row positions) the cells in the repeating patterns.

In the algorithm for generating the conditional-sum adder of FIG. 2, the number of special cells in the jth column of the adder is equal to $2\exp(j+1)$. For the case where $j=0$, then $2\exp(0+1)$ is equal to two and, therefore, there are two special cells—namely, an XOR XOR ACROSS cell and a MUX MUX IN cell—in the first two rows of the column designated j0.

For the case where j=1 in the algorithm that generates conditional-sum adder 12, then 2exp(1−1) is equal to four. Therefore, there are four special cells in the first four rows of the column designated j1. The four cells are, in order, a MUX XOR cell, a ONE MUX cell, a MUX XOR cell, and a ONE MUX cell.

For the case where j=2 in the algorithm, then 2exp(2−1) is equal to eight. Therefore, there are eight special cells in the column designated j2. Of those eight cells, the first 2exp(j) cells are blank cells. (Because 2exp(2) is equal to four, there are four blank cells in the lower portion of the column.) Then, the cell in the next-higher row of the column (i.e., the fifth row) is a MUX XOR cell. Finally, the column has a series of single MUX cells equal in number to 2exp(j)−1. (Because 2exp(2)−1 is equal to three, the column j2 has three single MUX cells.)

The preceding algorithm is summarized below in Table 1.

TABLE 1

| Column No. | Special Cell Sequence |
|---|---|
| j = 0 | an XOR XOR ACROSS cell and a MUX MUX IN cell |
| j = 1 | MUX XOR, ONE MUX, MUX XOR, ONE MUX |
| j = 2 | 2exp(j) blank cells, MUX XOR, and 2exp(j)−1 ONE MUX cells |

Above the special cells in any column of the adder of FIG. 2, there is a repeating pattern of cells in the following ascending order: 2exp(j)−1 blank cells, an XOR XOR ACROSS cell, and a MUX MUX IN cell. Then, above those cells, there are 2exp(j)−1 cells which are MUX MUX cells. Then, if necessary because of the selected bit width of the adder, the pattern repeats. If the top row of the repeating cells is an XOR XOR ACROSS cell or an XOR XOR cell, then that cell is replaced by a blank cell.

The algorithm for the repeating cells can be readily observed in the conditional-sum adder of FIG. 2. In the column j0, there are no repeating blank cells, because 2exp(0)−1 equals zero. The next two cells are the XOR XOR ACROSS and MUX MUX IN cells. There are no MUX MUX cells, because 2exp(0)−1 equals zero. Then, the pattern of pairs of XOR XOR ACROSS and MUX MUX IN cells repeats.

The algorithm for repeating cells can be similarly applied to the other columns of the conditional-sum adder of FIG. 2. For the adder, the number of rows in each column equals the bit width of the adder. For instance, a 17-bit adder would have seventeen elements in each column.

Table 2, below, provides an example of a list of cells generated by the foregoing algorithm for a conditional-sum adder whose bit width is ninety-six bits. The adder in this example has seven columns of cells. (The columns are indicated by the designations j=0, j=1, and so forth through j=6). In the example provided by the table, blank cells are designated ACROSS. Also, for any given column in the adder, the cells in the column are listed from row b0 upward to row b95.

TABLE 2

CELL LIST FOR NINETY-SIX BIT CONDITIONAL-SUM ADDER j = 0

XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.
XorXor, MxMxIn, XorXor, MxMxIn, XorXor, MxMxIn, XorXor, MxMxIn.

j = 1

MuxXor, OneMux, XorMux, OneMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.
Across, XorXor, MxMxIn, MuxMux, Across, XorXor, MxMxIn, MuxMux.

j = 2

Across, Across, Across, Across, MuxXor, OneMux, OneMux, OneMux.
Across, Across, Across, XorXor, MxMxIn, MuxMux, MuxMux, MuxMux.
Across, Across, Across, XorXor, MxMxIn, MuxMux, MuxMux, MuxMux.
Across, Across, Across, XorXor, MxMxIn, MuxMux, MuxMux, MuxMux.
Across, Across, Across, XorXor, MxMxIn, MuxMux, MuxMux, MuxMux.
Across, Across, Across, XorXor, MxMxIn, MuxMux, MuxMux, MuxMux.
Across, Across, Across, XorXor, MxMxIn, MuxMux, MuxMux, MuxMux.
Across, Across, Across, XorXor, MxMxIn, MuxMux, MuxMux, MuxMux.
Across, Across, Across, XorXor, MxMxIn, MuxMux, MuxMux, MuxMux.
Across, Across, Across, XorXor, MxMxIn, MuxMux, MuxMux, MuxMux.
Across, Across, Across, XorXor, MxMxIn, MuxMux, MuxMux, MuxMux.

j = 3

Across, Across, Across, Across, Across, Across, Across, Across.
MuxXor, OneMux, OneMux, OneMux, OneMux, OneMux, OneMux, OneMux.
Across, Across, Across, Across, Across, Across.

TABLE 2-continued
CELL LIST FOR NINETY-SIX BIT CONDITIONAL-SUM ADDER

Across, XorXor.
MxMxIn, MuxMux, MuxMux, MuxMux, MuxMux, MuxMux,
MuxMux, MuxMux.
Across, Across, Across, Across, Across, Across,
Across, XorXor.
MxMxIn, MuxMux, MuxMux, MuxMux, MuxMux, MuxMux,
MuxMux, MuxMux.
Across, Across, Across, Across, Across, Across,
Across, XorXor.
MxMxIn, MuxMux, MuxMux, MuxMux, MuxMux, MuxMux,
MuxMux, MuxMux.
Across, Across, Across, Across, Across, Across,
Across, XorXor.
MxMxIn, MuxMux, MuxMux, MuxMux, MuxMux, MuxMux,
MuxMux, MuxMux.
Across, Across, Across, Across, Across, Across,
Across, XorXor.
MxMxIn, MuxMux, MuxMux, MuxMux, MuxMux, MuxMux,
MuxMux, MuxMux.
j = 4
Across, Across, Across, Across, Across, Across,
Across, Across.
Across, Across, Across, Across, Across, Across,
Across, Across
MuxXor, OneMux, OneMux, OneMux, OneMux, OneMux,
OneMux, OneMux.
OneMux, OneMux, OneMux, OneMux, OneMux, OneMux,
OneMux, OneMux.
Across, Across, Across, Across, Across, Across,
Across, Across.
Across, Across, Across, Across, Across, Across,
Across, XorXor.
MxMxIn, MuxMux, MuxMux, MuxMux, MuxMux, MuxMux,
MuxMux, MuxMux.
MuxMux, MuxMux, MuxMux, MuxMux, MuxMux, MuxMux,
MuxMux, MuxMux.
Across, Across, Across, Across, Across, Across,
Across, Across.
Across, Across, Across, Across, Across, Across,
Across, XorXor.
MxMxIn, MuxMux, MuxMux, MuxMux, MuxMux, MuxMux,
MuxMux, MuxMux.
MuxMux, MuxMux, MuxMux, MuxMux, MuxMux, MuxMux,
MuxMux, MuxMux.
j = 5
Across, Across, Across, Across, Across, Across,
Across, Across.
Across, Across, Across, Across, Across, Across,
Across, Across.
Across, Across, Across, Across, Across, Across,
Across, Across.
Across, Across, Across, Across, Across, Across,
Across, Across
MuxXor, OneMux, OneMux, OneMux, OneMux, OneMux,
OneMux, OneMux.
OneMux, OneMux, OneMux, OneMux, OneMux, OneMux,
OneMux, OneMux.
OneMux, OneMux, OneMux, OneMux, OneMux, OneMux,
OneMux, OneMux.
OneMux, OneMux, OneMux, OneMux, OneMux, OneMux,
OneMux, OneMux.
Across, Across, Across, Across, Across, Across,
Across, Across.
Across, Across, Across, Across, Across, Across,
Across, Across.
Across, Across, Across, Across, Across, Across,
Across, Across.
Across, Across, Across, Across, Across, Across,
Across, XorXor.
j = 6
Across, Across, Across, Across, Across,
Across, Across, Across.
Across, Across, Across, Across, Across.
Across, Across, Across.
Across, Across, Across, Across, Across.
Across, Across, Across.
Across, Across, Across, Across, Across.
Across, Across, Across.
Across, Across, Across, Across, Across.
Across, Across, Across.

TABLE 2-continued
CELL LIST FOR NINETY-SIX BIT CONDITIONAL-SUM ADDER

Across, Across, Across, Across, Across.
Across, Across, Across.
Across, Across, Across, Across, Across.
Across, Across, Across.
Across, Across, Across, Across, Across.
Across, Across, Across.
MuxXor, OneMux, OneMux, OneMux, OneMux,
OneMux, OneMux, OneMux
OneMux, OneMux, OneMux, OneMux, OneMux
OneMux, OneMux, OneMux
OneMux, OneMux, OneMux, OneMux, OneMux
OneMux, OneMux, OneMux
OneMux, OneMux, OneMux, OneMux, OneMux
OneMux, OneMux, OneMux.

As noted above, the ninety-six bit adder described by Table 2 is comprised of seven columns with ninety-six cells in each column. This example was provided to illustrate the point that the algorithm for a 96-bit adder can be simply modified to provide conditional-sum adders of other bit widths.

Conditional-sum adder 11 of FIG. 1 can be generated by an algorithm similar to the algorithm for conditional-sum adder 12 of FIG. 2.

The foregoing has described the principles, preferred embodiments and modes of operation of the present invention. However, the present invention should not be construed as being limited to the particular embodiments discussed (i.e., conditional-sum adders). Instead, the invention should be understood to generally provide conditional-sum carry structures that have sufficiently regular architecture that they can be conveniently generated by automated compiler systems. The actual conditional-sum carry structure can be implemented for use as an adder, a subtractor, an ALU circuit, and other devices. Thus, the above-described embodiments should be regarded as illustrative rather than restrictive, and it should be appreciated that workers skilled in the art may make variations in those embodiments without departing from the spirit or scope of the present invention as defined by the following claims.

What is claimed is:

1. A conditional-sum carry structure that has an architecture which is sufficiently regular that the structure can be conveniently generated by automated compiler systems, comprising:
   a set of input cells each of which receives binary numbers and each of which generates at least one sum bit and two carry-out bits; and
   a set of binary logic elements including dual multiplexers, dual exclusive OR gates, multiplexer and exclusive OR gate circuits and single multiplexer units that are connected to the input cells in the set of input cells, the binary logic elements are structured in an array of at least two columns, with each column including sequences of cells arranged the following order:

| Column | Cell Sequence |
| --- | --- |
| j = 0 | an XOR XOR cell and a MUX MUX cell |
| j = 1 | MUX XOR, ONE MUX, MUX XOR, ONE MUX |
| j > 2 | 2$^j$ blank cells, MUX XOR, and 2$^j$ - 1 ONE MUX cells | where the columns of the array are designated j=0, j=1, and so forth, and where respective ones of the cells in the cell sequences are connected to the input cells in the set of input cells for receiving sum bits and carry-out bits from the input cells that are in the same row in at least one of the preceding columns, for performing the operations of a conditional-sum carry structure.

2. A conditional-sum carry structure according to claim 1 wherein the number of columns is a function of the base 2 logarithm of the bit width.

3. A conditional-sum carry structure having an architecture that is sufficiently regular that the structure can be conveniently generated by automated compiler systems, comprising:
   a set of input cells, each of which receives binary numbers and each of which generates at least one sum bit and two carry-out bits; and
   a set of binary logic elements including dual multiplexers, dual exclusive OR gates, multiplexer and exclusive OR gate circuits and single multiplexer units that are connected to the input cells for receiving the sum bits and carry-out bits and for performing the operations of a conditional-sum carry structure upon those bits;
   the set of binary logic elements being arranged in an array of at least two columns, with each column including the following cell sequences where the cells in each sequence are arranged in the order given below:

| Column | Special Cell Sequence |
| --- | --- |
| j=0 | an XOR XOR cell and a MUX MUX cell |
| j=1 | MUX XOR, ONE MUX, MUX XOR, ONE MUX |
| j≧2 | $2^j$ blank cells, MUX XOR, and $2^j$-1 ONE MUX cells | where the columns of the array are designated j=0, j=1, and so forth, and where the cells in the cell sequences are connected for receiving sum bits and carry-out bits from cells in the same row in at least one of the preceding columns.

4. A conditional-sum carry structure according to claim 22 wherein the array of columns of binary logic elements is comprised of the following repeating pattern of cells, where the cells in each repeating pattern are arranged in the following order:
   a) in each column, following the above-listed cells of that column $2^j$-1 blank cells, an XOR XOR cell, and $2^j$ MUX MUX cells; and
   b) then, (2j-1) cells that are MUX MUX cells where respective ones of the cells are connected to the input cells for receiving sum bits and carry-out bits from the input cells.

* * * * *

UNITED STATES PATENT AND TRADEMARK OFFICE
CERTIFICATE OF CORRECTION

PATENT NO. : 5,126,965

DATED : June 30, 1992

INVENTOR(S) : Creigton S. Asato; Christoph Ditzen

It is certified that error appears in the above-identified patent and that said Letters Patent is hereby corrected as shown below:

ON THE TITLE PAGE: Item [75] should read;
    Creigton S. Asato;
    Christoph Ditzen, both of
    San Jose, Calif.

Signed and Sealed this

Ninth Day of February, 1993

*Attest:*

STEPHEN G. KUNIN

*Attesting Officer*      *Acting Commissioner of Patents and Trademarks*